US012640645B2

(12) United States Patent (10) Patent No.: US 12,640,645 B2

Hayase (45) Date of Patent: May 26, 2026

(54) POWER CONVERSION DEVICE

(71) Applicant: Mitsubishi Electric Corporation, Tokyo (JP)

(72) Inventor: Kei Hayase, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 428 days.

(21) Appl. No.: 18/096,329

(22) Filed: Jan. 12, 2023

(65) Prior Publication Data

US 2023/0421071 A1    Dec. 28, 2023

(30) Foreign Application Priority Data

Jun. 28, 2022    (JP) ................................. 2022-103280

(51) Int. Cl.
    *H02M 3/00*     (2006.01)
    *H02M 3/155*    (2006.01)
    *H02M 3/335*    (2006.01)
    *H02M 7/00*     (2006.01)
    *H05K 7/20*     (2006.01)
(52) U.S. Cl.
    CPC ....... *H02M 3/003* (2021.05); *H02M 3/33573* (2021.05); *H05K 7/20927* (2013.01); *H02M 3/155* (2013.01); *H02M 7/003* (2013.01)
(58) Field of Classification Search
    CPC .............. H02M 3/003; H02M 3/33573; H05K 7/20927
    See application file for complete search history.

(56) References Cited

U.S. PATENT DOCUMENTS 6,005,773  A  *  12/1999  Rozman ................. H05K 7/209
                                                     363/141
2014/0126154  A1     5/2014  Higuchi et al.
2017/0005581  A1*    1/2017  Fukumasu .............. H02M 3/28
                    (Continued)

FOREIGN PATENT DOCUMENTS

JP        2001-332686 A      11/2001
JP        2004-215336 A       7/2004
                    (Continued)

OTHER PUBLICATIONS

Japanese Office Action dated Jul. 22, 2025, issued in Japanese application No. 2022-103280.
                    (Continued)

*Primary Examiner* — Jue Zhang
(74) *Attorney, Agent, or Firm* — Sughrue Mion, PLLC

(57) ABSTRACT

A power conversion device such that the number of parts is reduced, and a secondary side semiconductor element can be cooled using a simple configuration and at low cost, is provided. The power conversion device includes a multiple of semiconductor switching elements that convert a direct current voltage into an alternating current voltage, an isolation transformer that transmits the alternating current voltage from a primary side to a secondary side, and outputs the alternating current voltage, and a rectifying circuit including a multiple of diodes that rectify the output, wherein the multiple of semiconductor switching elements and the multiple of diodes are configured of a module wherein the multiple of semiconductor switching elements and the multiple of diodes are sealed in the same package.

20 Claims, 6 Drawing Sheets

(56)     References Cited

U.S. PATENT DOCUMENTS

2018/0332739 A1    11/2018   Takeuchi
2021/0144888 A1     5/2021   Sano et al.
2023/0361691 A1*   11/2023   Moteki ................... H01L 23/04

FOREIGN PATENT DOCUMENTS

JP        2013-031250  A      2/2013
JP        2018-190901  A     11/2018
JP          6516910  B1      5/2019
JP        2020-025430  A      2/2020
JP        2020-178406  A     10/2020

OTHER PUBLICATIONS

Japanese Office Action dated Dec. 9, 2025, issued in Japanese application No. 2022-103280.

* cited by examiner

POWER CONVERSION DEVICE

BACKGROUND OF THE INVENTION

Field of the Invention

The present application relates to the field of a power conversion device.

Description of the Related Art

A DC/DC converter is mounted in an electrified vehicle, such as an electric vehicle or a hybrid vehicle, in order to charge a low voltage lead battery from a high voltage lithium-ion battery. With an object of protection from high voltage, the high voltage lithium-ion battery is isolated from a chassis and a low voltage system, and the DC-DC converter also needs to be isolated from a high voltage input side and a low voltage output side, commonly using an isolation transformer. In this case, a direct current input voltage is switched using a semiconductor element or the like, thereby being converted into a signal of alternating current or the like and input into a primary side of the isolation transformer, and an output from a secondary side of the isolation transformer is rectified using a semiconductor element or the like, becoming a direct current output voltage.

It is often the case that a current of around several hundred amps or greater is needed as a current flowing into the secondary side of a DC-DC converter of an electrified vehicle, and it is difficult to apply a normal glass epoxy substrate, as a copper thickness is small, because of which a temperature rise caused by loss is considerable. Because of this, in, for example, Patent Literature 1, a copper plate with a certain thickness is used as wiring, a surface-mount discrete semiconductor element is mounted on the copper plate, and a rise in temperature of the wiring caused by a large current is restricted by fixing the copper plate to a cooler, together with which the discrete semiconductor element is cooled.

Patent Literature 1: JP6516910B

In order to secure cooling of a discrete semiconductor element mounted on a copper plate, the copper plate needs to be securely fixed to a cooler, and not only the copper plate acting as wiring, but also a screw and a bush that fix the copper plate are needed, there are a large number of parts, and costs are high not only in terms of materials but also manufacturing. Also, for the sake of flatness of the copper plate, which acts as input and output wiring of the discrete element, and securing strength for fixing, the copper plate needs to be insert molded, which is also a factor in an increase in costs. Furthermore, there is a need to align a multiple of discrete semiconductor elements in accordance with an output current, and the copper plate increases in size. In order to fix a larger metal plate, the number of screws increases, and the copper plate increases still further in size, meaning that an area that needs cooling increases, and there is a problem in that the cooler increases in cost. In particular, a circuit configuration in which isolation from the cooler is needed in a copper plate whose discrete semiconductor element is cooled is such that a thickness of grease or a gap filler between the copper plate and the cooler needs to be increased when attempting to secure isolation reliability, because of which a cooling performance worsens, and furthermore, a reduction in cost is hindered by an increase in discrete semiconductor elements and an increase in size of the copper plate.

SUMMARY OF THE INVENTION

The present application has been made to solve the above problems, and an object of the present application is to provide a power conversion device such that the number of parts is reduced, and a secondary side semiconductor element can be cooled using a simple configuration and at low cost.

A power conversion device disclosed in the present application includes a multiple of semiconductor switching elements that convert a direct current voltage of a direct current power supply into an alternating current voltage, an isolation transformer that transmits the alternating current voltage from a primary side to a secondary side, and outputs the alternating current voltage, and a rectifying circuit including a multiple of rectifying elements that rectify the output, wherein the multiple of semiconductor switching elements and the multiple of rectifying elements are configured of a module wherein the multiple of semiconductor switching elements and the multiple of rectifying elements are sealed in the same package.

According to the power conversion device disclosed in the present application, a power conversion device such that the number of parts is reduced, and a secondary side semiconductor element can be cooled using a simple configuration and at low cost, is obtained.

The foregoing and other objects, features, aspects, and advantages of the present disclosure will become more apparent from the following detailed description of the present disclosure when taken in conjunction with the accompanying drawings.

DETAILED DESCRIPTION OF THE PREFERRED EMBODIMENTS

Figure 1:
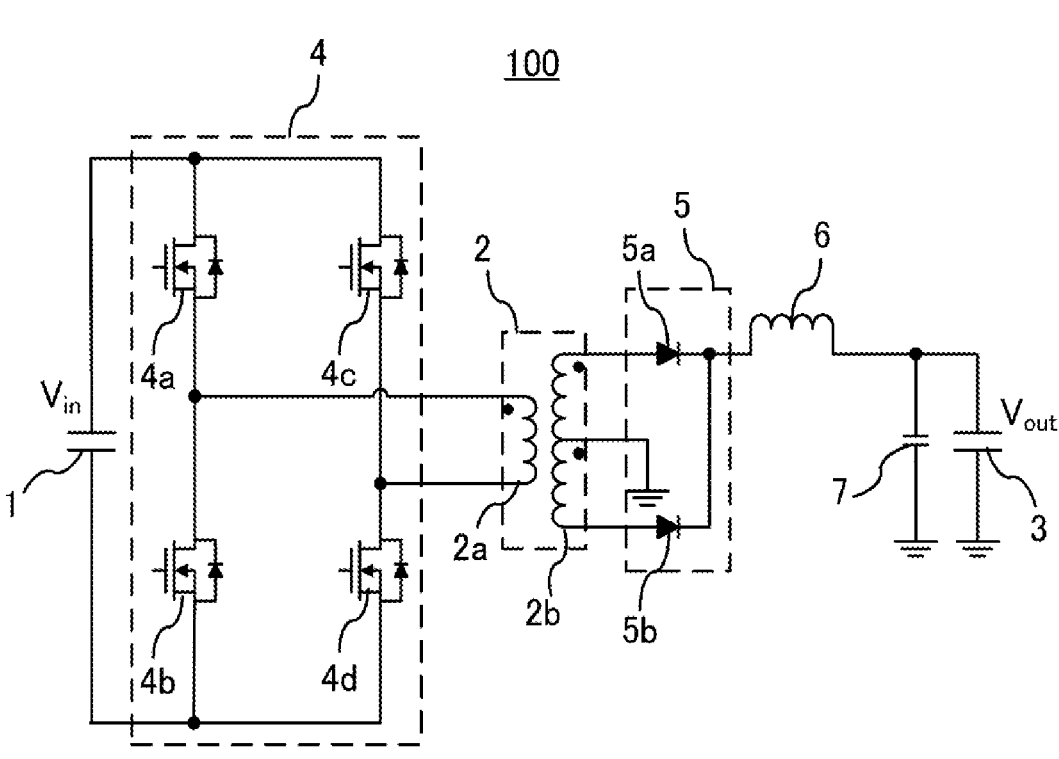
FIG. 1 is a circuit diagram of a power conversion device according to a first embodiment.

Hereafter, preferred embodiments of a power conversion device according to the present application will be described, using the drawings. Identical or corresponding members and regions in the drawings will be described with identical reference signs allotted.

FIG. 1 is a circuit configuration drawing of a power conversion device according to a first embodiment. As shown in FIG. 1, a power conversion device 100 converts a direct current voltage Vin of a direct current power supply 1 into a secondary side direct current voltage isolated by a transformer 2, and outputs a direct current voltage Vout to a load 3 such as a battery.

The power conversion device 100 includes the isolated transformer 2, a single phase inverter 4 acting as an inverter that is connected to a primary winding 2a of the transformer 2, and converts the direct current voltage Vin of the direct current power supply 1 into an alternating current voltage by semiconductor switching elements 4a to 4d formed of MOSFETs wherein a diode is incorporated between a source and a drain being of a full-bridge configuration, and a rectifying circuit 5 that is connected to a secondary winding 2b of the transformer 2, and in which diodes 5a and acting as rectifying elements, which are semiconductor elements, are disposed. Also, an output smoothing smoothing reactor 6 and a smoothing capacitor 7 are connected to an output of the rectifying circuit 5, and the direct current voltage Vout is output to the load 3. The secondary side of the transformer 2 is a center-tapped type, a center tap terminal is connected to a ground, and other secondary side terminals are connected one each to anode terminals of the diodes 5a and 5b. Cathode terminals of the diodes 5a and are connected to the smoothing reactor 6.

Heretofore, a DC/DC converter whose secondary side is of a center-tapped type has been shown as an example of the power conversion device 100, but the secondary side may also be of a full-bridge configuration, and also, a diode has been shown as an example of a rectifying element, but a MOSFET may also be used. Furthermore, although a DC/DC converter whose primary side is a full bridge has been shown as an example, anything, such as a forward type, a flyback type, or an LLC type, may be used, provided that the converter is an isolated converter having an isolation transformer. The semiconductor switching elements 4a to 4d, not being limited to MOSFETs, may also be self-arc-extinguishing semiconductor switching elements, such as insulated gate bipolar transistors (IGBTs), to which a diode is connected in antiparallel. The same applies when the rectifying element is a MOSFET.

Next, a configuration of a module wherein the primary side semiconductor switching elements 4a to 4d and the secondary side diodes 5a and 5b in the present embodiment are sealed in the same package will be described, using FIGS. 2A and 2B. Places in FIGS. 2A and 2B corresponding to FIG. 1 will be described using the same reference signs.

Figure 2A:
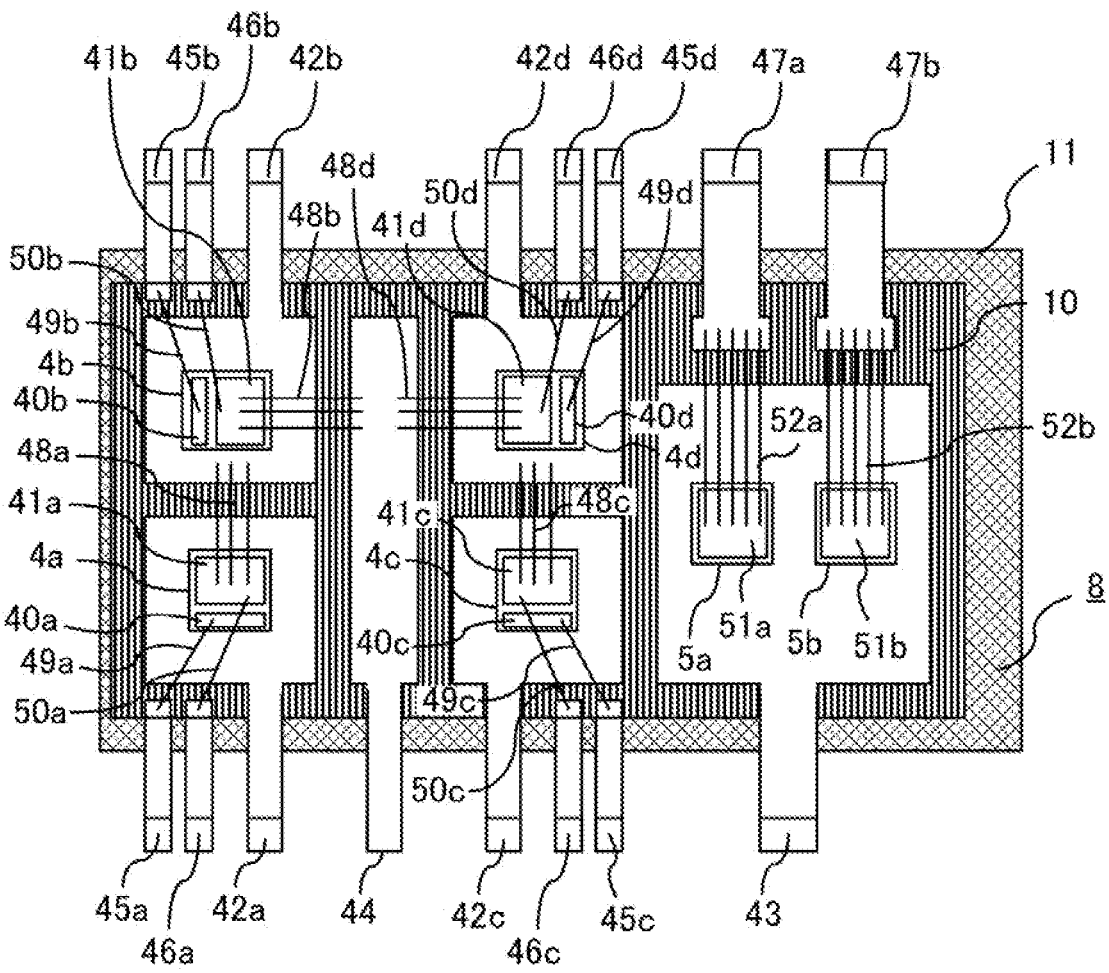
FIGS. 2A and 2B are drawings showing an internal configuration of a module of the power conversion device according to the first embodiment.
Figure 2B:
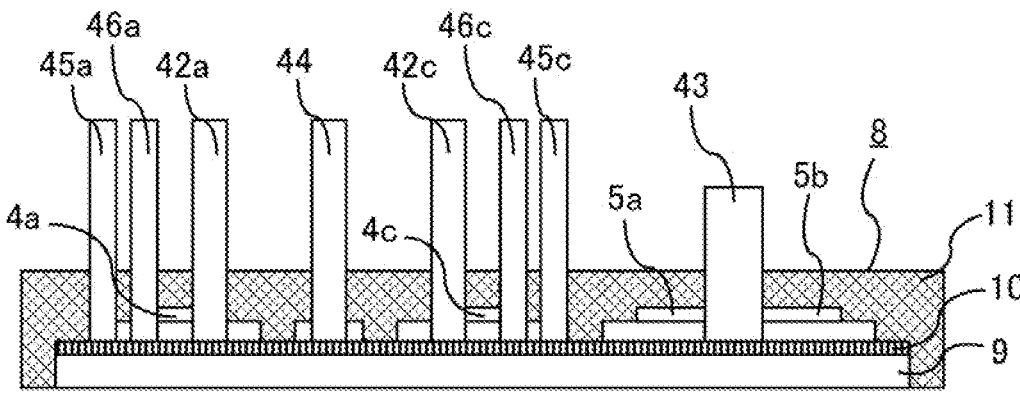

FIG. 2A is an upper perspective view of a module 8, and FIG. 2B is a sectional perspective view of FIG. 2A seen from a frontal direction. A sectional structure of the module 8 will be described using FIGS. 2A and 2B.

The semiconductor switching elements 4a to 4d are, for example, semiconductor chips having a drain pad on a bottom face, and having gate pads 40a to 40d and source pads 41a to 41d respectively on an upper face. The semiconductor switching elements 4a to 4d are mounted on lead frames 42a to 42d respectively. The diodes 5a and 5b have, for example, a cathode pad on a bottom face and an anode pad on an upper face, and are mounted on a lead frame 43.

Reference signs 44, 45a to 45d, 46a to 46d, 47a, and 47b indicate lead frames, and the lead frames 43, 44, 42a to 42d, 45a to 45d, 46a to 46d, 47a, and 47b are isolated from a cooling plate 9 by an isolating member 10. The semiconductor switching elements 4a to 4d, the diodes 5a and 5b, the lead frames 43, 44, 42a to 42d, 45a to 45d, 46a to 46d, 47a, and 47b, the cooling plate 9, and the isolating member 10 are molded in a resin 11, causing a face of the cooling plate 9 in a direction of a bottom face of the module 8 to be exposed. Also, the lead frames 42a to 42d, 43, 44, 45a to 45d, 46a to 46d, 47a, and 47b are bent in a direction of an upper face of the module 8, configuring external terminals. Connection wiring such as bonding is omitted from the sectional perspective view of FIG. 2B.

Next, the upper perspective view of the module 8 shown in FIG. 2A will be described.

The drain pad of the semiconductor switching element 4a is mounted on the lead frame 42a, and the lead frame 42a is connected to a positive electrode of the direct current power supply 1 via a glass epoxy substrate wiring pattern or the like. The source pad 41a of the semiconductor switching element 4a is connected to the lead frame 42b by wire bonding 48a, and the lead frame 42b is connected to the primary winding 2a of the transformer 2 via a glass epoxy substrate wiring pattern or the like.

The drain pad of the semiconductor switching element 4b is mounted on the lead frame 42b. The source pad 41b of the semiconductor switching element 4b is connected to the lead frame 44 by wire bonding 48b, and the lead frame 44 is connected to a negative electrode of the direct current power supply 1 via a glass epoxy substrate wiring pattern or the like.

The drain pad of the semiconductor switching element 4c is mounted on the lead frame 42c, and the lead frame 42c is connected to the positive electrode of the direct current power supply 1 via a glass epoxy substrate wiring pattern or the like.

The source pad 41c of the semiconductor switching element 4c is connected to the lead frame 42d by wire bonding 48c, and the lead frame 42d is connected to the primary winding 2a of the transformer 2 via a glass epoxy substrate wiring pattern or the like.

The drain pad of the semiconductor switching element 4d is mounted on the lead frame 42d. The source pad 41d of the semiconductor switching element 4d is connected to the lead frame 44 by wire bonding 48d.

Also, the gate pads 40a to 40d of the semiconductor switching elements 4a to 4d respectively are connected to the lead frames 45a to 45d respectively by wire bondings 49a to 49d. The lead frames 45a to 45d are connected to a gate circuit mounted on a glass epoxy substrate via a glass epoxy substrate wiring pattern. Furthermore, gate drive reference potentials of the semiconductor switching elements 4a to 4d are connected from the source pads 41a to 41d respectively to the lead frames 46a to 46d respectively using wire bondings 50a to 50d. The lead frames 46a to 46d are connected one each to gate circuit reference potentials mounted on a glass epoxy substrate via a glass epoxy substrate wiring pattern.

Heretofore, an example wherein the gate drive reference potentials of the semiconductor switching elements 4a to 4d are connected from the source pads 41a to 41d to the lead frames 46a to 46d respectively using the wire bondings 50a to 50d has been shown, but gate drive pads separate to the source pads 41a to 41d may be provided on each of the semiconductor switching elements 4a to 4d, and the gate drive reference potentials may be connected from the gate drive pads to the lead frames 46a to 46d respectively using the wire bondings 50a to 50d.

The diode 5a is connected from an anode pad 51a to the lead frame 47a by wire bonding 52a, and the lead frame 47a is connected to the secondary winding 2b of the transformer 2 by soldering, welding, or the like. Also, the diode 5b is connected from an anode pad 51b to the lead frame 47b by wire bonding 52b, and the lead frame 47b is connected to the secondary winding 2b of the transformer 2 by soldering, welding, or the like. Also, the cathode pads of the diodes 5a and 5b are mounted on the same lead frame 43, and the lead frame 43 is connected to the smoothing reactor 6.

Herein, the lead frames 42a to 42d, 44, 45a to 45d, and 46a to 46d are primary side external terminals, and the lead frames 43, 47a, and 47b are secondary side external terminals. Also, the lead frames 42a, 42c, and 44 are primary side direct current input terminals among the primary side external terminals, and the lead frames 42b and 42d are primary side alternating current output terminals among the primary side external terminals. Furthermore, the lead frames 47a and 47b are secondary side alternating current input terminals among the secondary side external terminals, and the lead frame 43 is a secondary side direct current output terminal.

The lead frames 42b and 42d may be connected on a glass epoxy substrate that is an outer side of the module 8, or may be connected in a module interior by mounting a busbar that straddles the lead frame 44. Also, although an example wherein there is one each of the gate wire bondings 49a to 49d and three drain wire bondings has been shown, these quantities are not limiting. Also, a busbar may be used instead of wire bonding.

Figures 3A, 3B:
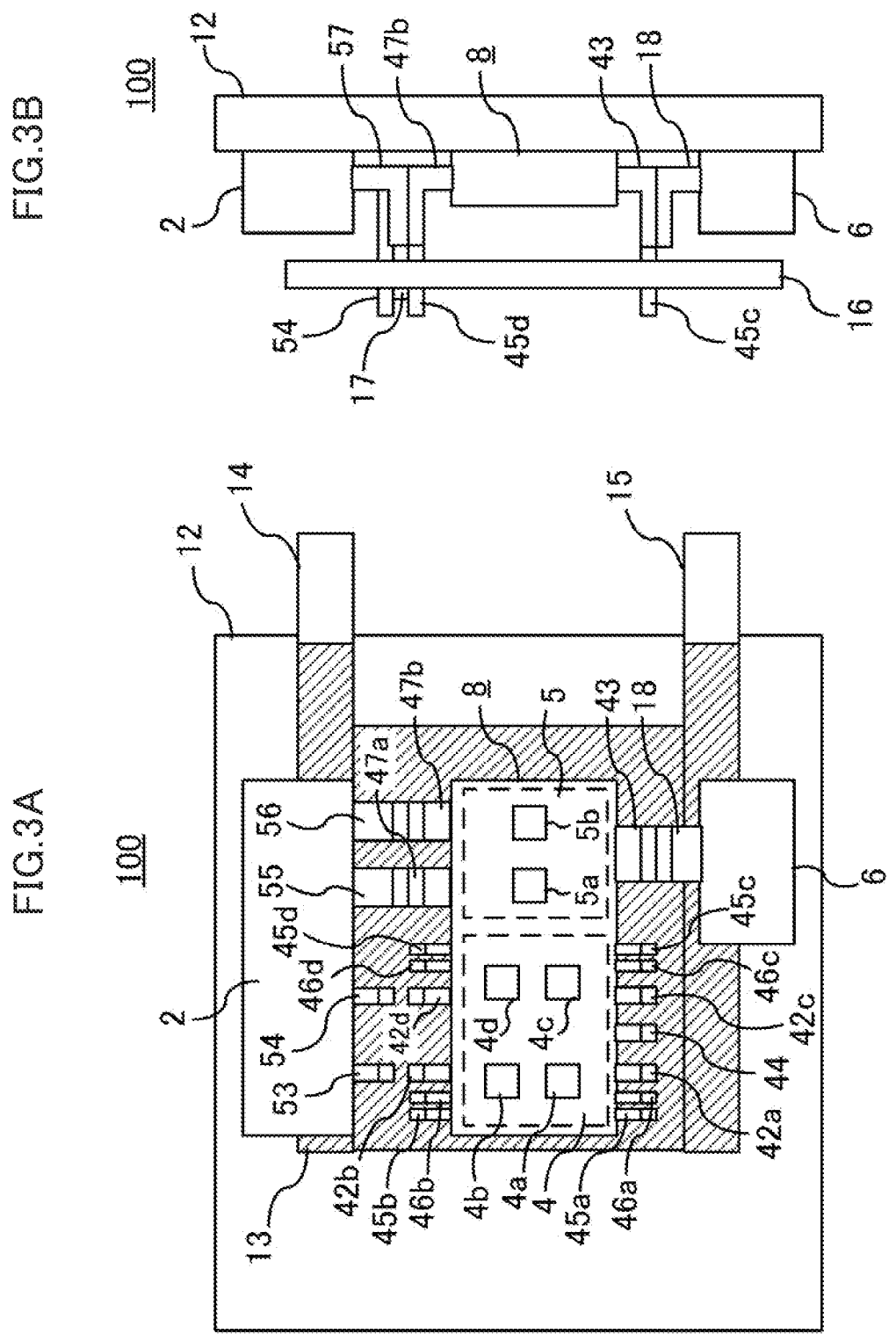
FIGS. 3A and 3B are drawings showing a mounted structure of the power conversion device according to the first embodiment.

Next, a method of mounting a power conversion device in a housing that houses a power conversion device of the present embodiment will be described, using FIGS. 3A and 3B. FIG. 3A is a plan view showing a mounted structure of the power conversion device 100, and FIG. 3B is a left side view representing an external terminal connection relationship.

In FIGS. 3A and 3B, an entrance 14 to a channel 13 of cooling water, which is a refrigerant that cools the module 8, the transformer 2, the smoothing reactor 6, and the like, which are main heat generating parts of the power conversion device 100, and an exit 15 from the water channel 13, are provided in a housing 12. The housing 12 functions as a cooler using cooling water flowing along the channel 13, and the module 8 is stacked in a normal direction of the cooler. The module 8, the transformer 2, and the smoothing reactor 6 are mounted on a projection plane of the channel 13. A substrate 16 is mounted in such a way as to coincide with the module 8. At this time, the substrate 16 may coincide with at least one portion of the transformer 2 and the smoothing reactor 6. The module 8 is such that places the same as in FIGS. 2A and 2B are represented by identical reference signs, only the semiconductor switching elements 4a to 4d configuring the inverter 4 and the diodes 5a and 5b configuring the rectifying circuit 5 are depicted, and the cooling plate 9, the isolating member 10, the bonding wires, and the like, are omitted.

In FIG. 3A, the inverter 4 is mounted in a left side region of the module 8, and the rectifying circuit 5 is mounted in a right side region of the module 8. The lead frames 42a, 42c, and 44, which form external terminals connecting the inverter 4 to the direct current power supply 1, are positioned in a side face of the module 8 opposing the smoothing reactor 6, pass through a through hole provided in the substrate 16 together with the lead frames 45a and 45c, which form gate terminals of the semiconductor switching elements 4a and 4c respectively, and are connected by soldering or the like to the substrate 16. The lead frames 42b and 42d, which form external terminals connecting the inverter 4 to the transformer 2, are positioned in a side face of the module 8 opposing the transformer 2, pass through a through hole provided in the substrate 16 together with the lead frames 45b and 45d, which form gate terminals of the semiconductor switching elements 4b and 4d respectively, and are connected by soldering or the like to the substrate 16.

The lead frames 47a and 47b, which are external terminals connecting the rectifying circuit 5 to the transformer 2, are positioned in a side face of the module 8 opposing the transformer 2, and the lead frame 43, which is an external terminal connecting the rectifying circuit 5 to the smoothing reactor 6, is positioned in a side face of the module 8 opposing the smoothing reactor 6. Terminals 53, 54, 55, and 56 of the transformer 2 are all positioned on the module 8 side, wherein the terminals 53 and 54, which connect the transformer 2 to the inverter 4, pass through a though hole provided in the substrate 16, are connected by soldering or the like to the substrate 16, and are connected respectively to the lead frames 42b and 42d, which are external terminals of the module 8, via wiring 17 on the substrate 16. Also, the terminals 55 and 56 of the transformer 2, which connect transformer 2 to the rectifying circuit 5, are disposed in such a way as to respectively oppose the lead frames 47a and 47b, which are external terminals of the module 8, and are connected by welding or the like to the lead frames 47a and 47b.

The lead frame 43, which is an external terminal connecting the rectifying circuit 5 to the smoothing reactor 6, is positioned in a side face of the module 8 opposing the smoothing reactor 6, and is connected by welding or the like to a terminal 18 of the smoothing reactor 6.

Figure 4:
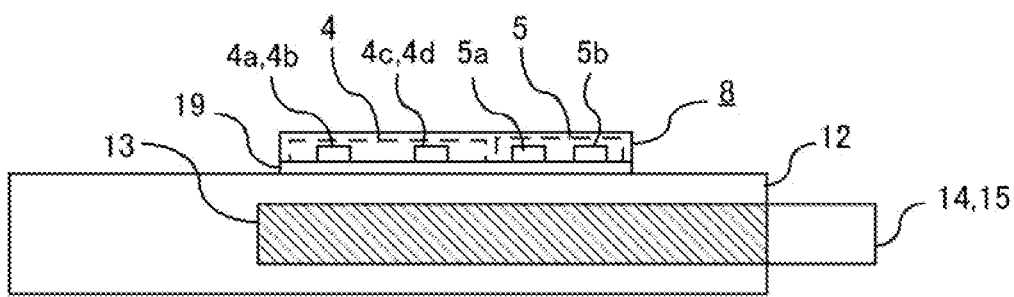
FIG. 4 is a side view showing a mounted structure of the power conversion device according to the first embodiment.

FIG. 4 shows positional relationships between the housing 12 and the channel 13, the module 8, the inverter 4, and the rectifying circuit 5. The channel 13 provided in an interior of the housing 12 is a flat-type channel, and the module 8 is disposed on the projection plane of the channel 13, and mounted in the housing 12 across a cooling member 19 such as grease or a gap filler. Also, the semiconductor switching elements 4a to 4d configuring the inverter 4 and the diodes 5a and 5b configuring the rectifying circuit 5 are cooled using the channel 13 via the cooling member 19 and the housing 12.

According to the heretofore described embodiment, the module 8 wherein the semiconductor switching elements 4a to 4d on the primary side of a DC/DC converter and the diodes and 5b on the secondary side are sealed in the same package is adopted, because of which there is no longer a need for a cooling structure unique to a secondary side including a metal plate for mounting a discrete package, a fixing bush and screw, an insert resin for securing flatness and strength of the metal plate, and the like, which is necessary when the diodes 5a and 5b are discrete packages, the number of parts can be reduced, and a cooling configuration can be reduced in cost. Also, owing to a reduction in size obtained by reducing the number of parts, an area needed for cooling can be reduced, and the diodes and 5b can be cooled at low cost owing to a reduction in size of the housing 12.

In addition, by adopting a module wherein the diodes 5a and 5b are integrated with the primary side semiconductor switching elements 4a to 4d, which are the same kind of semiconductor chip as the secondary side diodes 5a and 5b and need cooling in the same way, the diodes 5a and 5b can share the cooling plate 9 with the semiconductor switching elements 4a to 4d, and cooling of the diodes 5a and 5b can be reduced in cost. Furthermore, by sharing the isolating member 10 with the semiconductor switching elements 4a to 4*d*, which need isolation from the housing 12, isolation of the diodes 5*a* and 5*b* from the housing 12 can be reduced in cost.

In the present embodiment, a circuit configuration wherein the center tap of the transformer 2 is connected to the ground, and the diodes 5*a* and 5*b* are of a potential differing from the ground, has been shown as an example, but the present application may also be applied to a circuit configuration wherein the center tap of the transformer 2 is connected to the smoothing reactor 6, and the anode termi-nals of the diodes 5*a* and 5*b* are connected to the ground. In this case, the anodes of the diodes 5*a* and 5*b* may be connected to the cooling plate 9, because of which the isolating member 10 on a projection plane of the lead frames 47*a* and 47*b* on which the anode terminals of the diodes 5*a* and 5*b* are mounted becomes unnecessary, and costs can be reduced.

In the present embodiment, the primary side semiconduc-tor switching elements 4*a* to 4*d* configure a full-bridge circuit, because of which there are a large number of elements, a package portion other than a chip needed for a discrete semiconductor and a clearance between packages are unnecessary, and an advantage in size reduction obtained by adopting the module 8, wherein the semiconductor switching elements 4*a* to 4*d* and the secondary side diodes 5*a* and 5*b* are sealed in the same package, is considerable. Because of this, the area needed for cooling can be reduced, and the cooler can be reduced in size. Also, a full-bridge circuit can generally accommodate a large output power, meaning that when a cooling structure of the secondary side diodes 5*a* and 5*b* is a factor in a cost increase in a high output power application, the number of parts in the cooling structure can be reduced, and an advantage in reducing cooling configuration costs is considerable.

In the present embodiment, the diodes 5*a* and 5*b* are used as secondary side rectifying elements, because of which a gate terminal that is needed in a switching element such as a MOSFET is unnecessary, and there are few terminals, meaning that a size of the module 8 in a longitudinal direction in which external terminals are aligned is not dictated by the number of terminals, and the module 8 can be reduced in size. Because of this, the area needed for cooling can be reduced, and the cooler can be reduced in size.

In the present embodiment, the lead frames 43, 44, 42*a* to 42*d*, 45*a* to 45*d*, 46*a* to 46*d*, 47*a*, and 47*b*, which are external terminals of the module 8, are aligned on two side faces of the module 8, because of which the longitudinal direction of the module 8 can be reduced in length, without being dictated by terminal width and a clearance between external terminals required for reasons of strength, heat generated by an energizing current, or the like, which is a problem when the lead frames are gathered on one side. Also, in order to shorten a lead frame and a bonding wire, the semiconductor switching elements 4*a* to 4*d* and the diodes 5*a* and 5*b* are normally disposed near the relevant external terminal, meaning that by disposing the external terminals on two side faces of the module 8, a mounting area of the semiconductor switching elements 4*a* to 4*d* and the diodes 5*a* and 5*b* can be brought nearer. Because of this, the area needed for cooling can be reduced, and the cooler can be reduced in size.

Furthermore, in the present embodiment, the direction in which the inverter 4 configured of the semiconductor switching elements 4*a* to 4*d* and the rectifying circuit 5 configured of the diodes 5*a* and 5*b* are aligned and the direction in which the external terminals are aligned are the same (that is, the longitudinal direction of the module 8), because of which the lead frames 42*a* to 42*d*, 44, 45*a* to 45*d*, and 46*a* to 46*d*, which are external terminals connected to the inverter 4 configured of the semiconductor switching elements 4*a* to 4*d*, can be disposed near the inverter 4. Also, the lead frames 43, 47*a*, and 47*b*, which are external terminals connected to the rectifying circuit 5 configured of the diodes 5*a* and 5*b*, can be disposed near the rectifying circuit 5. Because of this, an increase in size of the module 8 caused by a wasteful routing of wiring can be restricted, and noise or a surge caused by wiring increasing in length can also be restricted.

Furthermore, in the present embodiment, the lead frames 42*a*, 42*c*, and 44, which are input external terminals of the inverter 4 configured of the semiconductor switching ele-ments 4*a* to 4*d* and connected to the direct current power supply 1, are on a first side face of the module 8 (a lower side in FIGS. 2A and 2B), and the lead frames 42*b* and 42*d*, which are output external terminals of the inverter 4 con-nected to the primary winding 2*a* of the transformer 2, are on a second side face of the module 8 (an upper side in FIGS. 2A and 2B). Also, the lead frames 47*a* and 47*b*, which are input external terminals of the rectifying circuit 5 configured of the diodes 5*a* and 5*b* and connected to the secondary winding 2*b* of the transformer 2, are on the second side face of the module 8 (the upper side in FIGS. 2A and 2B), and the lead frame 43, which is an output external terminal of the rectifying circuit 5 connected to the smoothing reactor 6, is on the first side face of the module 8 (the lower side in FIGS. 2A and 2B). Because of this, the input external terminals and the output external terminals of the inverter 4 and the rectifying circuit 5 can be disposed on differing side faces of the module 8, and the longitudinal direction of the module 8 can be reduced in length.

Also, in order to shorten a lead frame or a bonding wire, the semiconductor switching elements 4*a* to 4*d* and the diodes 5*a* and 5*b* are normally disposed near the relevant external terminal, meaning that by disposing the external terminals on two side faces of the module 8, a mounting area of the semiconductor switching elements 4*a* to 4*d* and the diodes 5*a* and 5*b* can be brought nearer, the area needed for cooling can be reduced, and the cooler can be reduced in size. Furthermore, the lead frames 42*b*, 42*d*, 47*a*, and 47*b*, which are external terminals for connection to the trans-former 2, are on the second side face of the module 8 (the upper side in FIGS. 2A and 2B), because of which costs can be reduced by shortening wiring connected to the trans-former 2.

In the present embodiment, an example wherein the lead frames 42*a* to 42*d*, 43, 44, 45*a* to 45*d*, 46*a* to 46*d*, 47*a*, and 47*b*, which are external terminals of the module 8, are aligned on two side faces of the module 8 has been shown, but one portion of the lead frames that are external terminals may be disposed in a lateral direction. For example, the lead frames 42*a*, 42*c*, and 44, which are input external terminals of the inverter 4 configured of the semiconductor switching elements 4*a* to 4*d* and connected to the direct current power supply 1, may be on a third side face of the module 8 (a left side in FIGS. 2A and 2B), and the lead frame 43, which is an output external terminal of the rectifying circuit 5 con-figured of the diodes 5*a* and 5*b* and connected to the smoothing reactor 6, may be on a fourth side face of the module 8 (a right side in FIGS. 2A and 2B). When a connection interface with the direct current power supply 1 is in a direction to the left of the module 8 in FIGS. 2A and 2B, or when the smoothing reactor 6 is disposed in a direction to the right of the module 8 in FIGS. 2A and 2B, costs can be reduced by the connection interface between the module 8 and the direct current power supply 1, or wiring connecting the module 8 and the smoothing reactor 6, being shortened.

In the present embodiment, the power conversion device 100 has a cooler configured of the housing 12 and the channel 13, which cools the module 8, meaning that when sizes of the lead frames 42a to 42d and 43 are restricted in order to cause heat dissipating properties of the semiconductor switching elements 4a to 4d and the diodes 5a and 5b to improve in an application wherein output power is high or the like, the lead frames 42a to 42d and 43 can be reduced in size, the module 8 can be reduced in size, and the cooler configured of the housing 12 and the channel 13 can be reduced in size. Because of this, the power conversion device 100 can be reduced in cost.

Also, as the cooling water flows in a direction perpendicular to the direction in which the inverter 4 and the rectifying circuit 5 of the module 8 are aligned, the inverter 4 and the rectifying circuit 5 of the module 8 are not affected by cooling water whose temperature rises due to heat generated by the inverter 4 and the rectifying circuit 5. Because of this, a temperature rise can be restricted, and the module 8 can be reduced in size. Because of this, the cooler configured of the housing 12 and the channel 13 can be reduced in size, and the power conversion device 100 can be reduced in cost.

Furthermore, as the transformer 2 and one portion of the smoothing reactor 6 are outside the projection plane of the channel 13, the inverter 4 and the rectifying circuit 5 of the module 8, which are more efficiently cooled by the channel 13 than the transformer 2 and the smoothing reactor 6 as a cooling area with respect to height is greater, are disposed with priority in the channel 13, the module 8 can be reduced in size, and the cooler configured of the housing 12 and the channel 13 can be reduced in size. Because of this, the power conversion device 100 can be reduced in cost.

Second Embodiment

Figure 5:
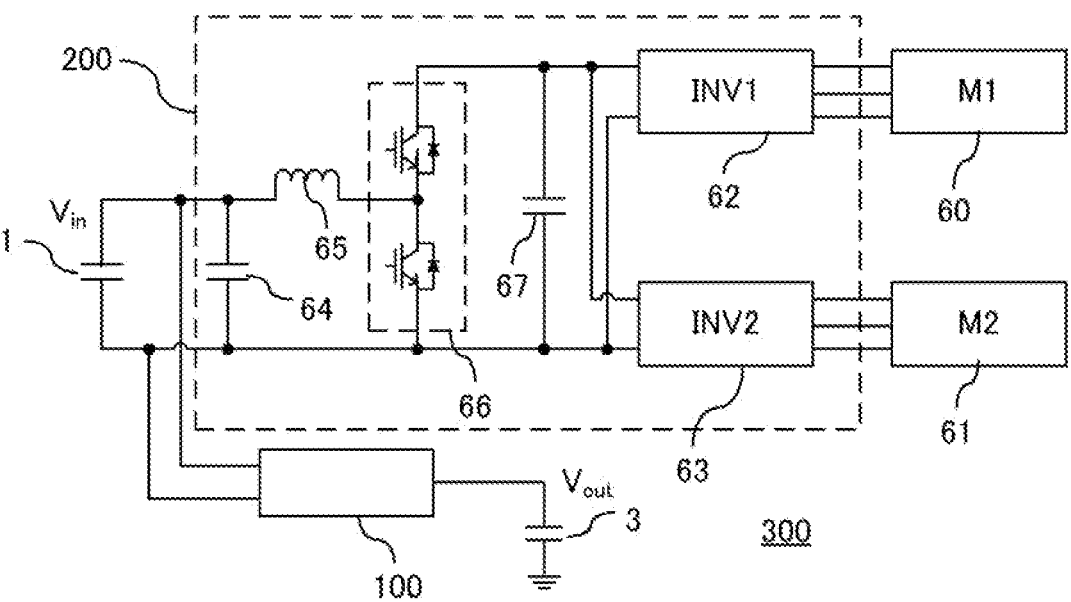
FIG. 5 is a circuit diagram of a power conversion device according to a second embodiment.

Next, a power conversion device according to a second embodiment will be described. FIG. 5 is a circuit diagram of the power conversion device according to the second embodiment.

As shown in FIG. 5, a power conversion device 300 according to the second embodiment is configured by a power conversion device 200 configured to include inverters 62 and 63 that drive, for example, vehicle drive motors 60 and 61 respectively being combined with the power conversion device 100 described in the first embodiment.

An input capacitor 64 that causes a direct current input voltage to stabilize is connected in parallel to the direct current power supply 1, and a step-up reactor 65 is connected to a positive electrode side of the input capacitor 64. An output of the step-up reactor 65 is connected to a midpoint of a switching element 66 formed in a half-bridge, and a step-up chopper is configured of the step-up reactor 65 and the half-bridge switching element 66. An output of the half-bridge switching element 66 is smoothed by a smoothing capacitor 67. The inverter 62 is connected, with the smoothing capacitor 67 as an input, and three-phase output lines of the inverter 62 are connected to the motor 60. Also, the regeneration inverter 63 is connected in parallel to the inverter 62, and the motor 61 is connected via three-phase lines. By voltage being raised in the step-up chopper configured of the step-up reactor 65 and the half-bridge switching element 66, wiring from the smoothing capacitor 67 to the inverters 62 and 63 can be shortened, and current from the inverters 62 and 63 to the motors 60 and 61 respectively can be reduced in the same power condition. Because of this, the wiring can be thinner, which has advantages of reducing cost and reducing weight. The half-bridge switching element 66 is, for example, an IGBT to which a diode is connected in antiparallel.

Figure 6:
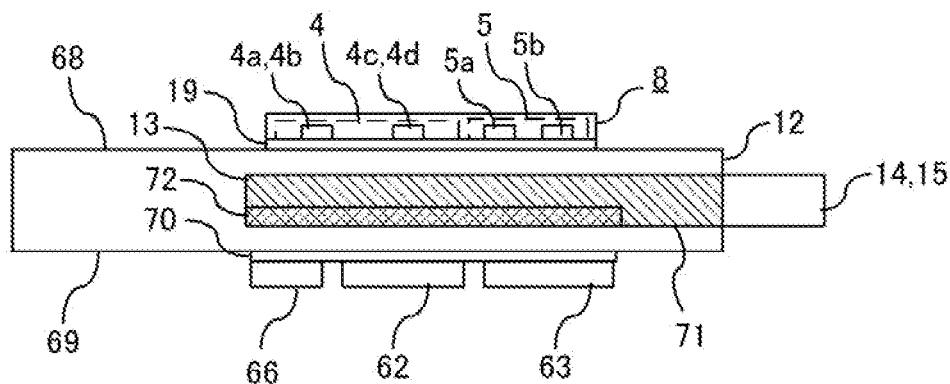
FIG. 6 is a side view showing a mounted structure of the power conversion device according to the second embodiment.

As an internal structure of the module 8 of the power conversion device 100 configuring the power conversion device 300 of the present embodiment and a mounted structure of the power conversion device 100 are the same as in FIGS. 2A and 2B and FIGS. 3A and 3B respectively, a detailed description will be omitted. FIG. 6 shows a positional relationship between the housing 12 and the channel 13, the module 8 of the power conversion device 100, and necessary constituent members of the power conversion device 200, and is a drawing illustrating only differences from FIG. 4. Constituent components the same as in FIG. 4 are shown using identical reference signs.

In FIG. 6, the channel 13 of, for example, a flat type is provided in the housing 12, and the half-bridge switching element 66 and the inverters 62 and 63 are mounted across a second cooling member 70, such as grease or a gap filler, on a second face 69 on an opposite side parallel to a first face 68 on which the module 8 of the power conversion device 100 is mounted in the housing 12. The input capacitor 64, the step-up reactor 65, and the smoothing capacitor 67 are omitted from FIG. 6. The half-bridge switching element 66 and the inverters 62 and 63 are each modularized, and are aligned in the same direction as the direction in which the inverter 4 and the rectifying circuit 5 of the module 8 are aligned. Also, the half-bridge switching element 66 and the inverters 62 and 63 have a cooling face of a structure the same as that of the module 8, and the cooling face opposes the second cooling member 70. The order in which the half-bridge switching element 66 and the inverters 62 and 63 are aligned is one example, and any order of alignment may be adopted. Also, a fin 72 for increasing a cooling performance of the second face 69 of the housing 12 is disposed on a third face 71 of the channel 13 opposing the second face 69 of the housing 12. Heat generated by the half-bridge switching element 66 and the inverters 62 and 63 is dissipated to the channel 13 via the second cooling member 70, the housing 12, and the fin 72.

Figure 7:
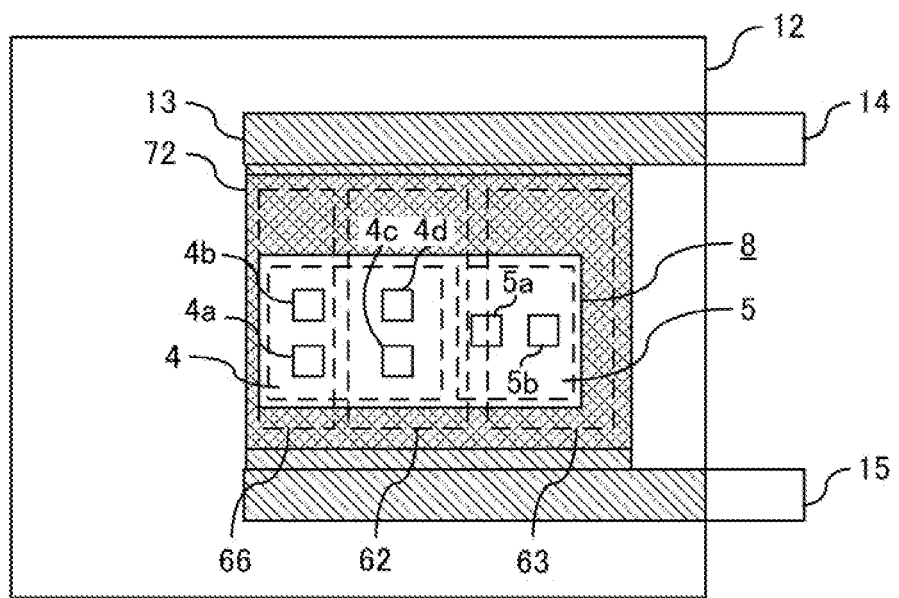
FIG. 7 is a plan view showing a mounted structure of the power conversion device according to the second embodiment.

FIG. 7 is a plan view showing a positional relationship between the channel 13 and the fin 72, the module 8 configuring the power conversion device 100, and the half-bridge switching element 66 and the inverters 62 and 63 configuring the power conversion device 200.

The fin 72 is disposed in the channel 13 on a projection plane of the half-bridge switching element 66 and the inverters 62 and 63, and the module 8 is disposed on a projection plane of the fin 72. The cooling water enters the channel 13 from the entrance 14, and flows to the exit 15 through a region in which the fin 72 is disposed. Generally, the power conversion device 200, which drives the motors 60 and 61 that form power of an electrified vehicle, has an output power greater than that of the power conversion device 100, which is a DC-DC converter that charges a lead battery in an electrified vehicle, because of which the fin 72 is provided in the channel 13 on the side on which the power conversion device 200 is mounted in order to reduce the sizes of the half-bridge switching element 66 and the inverters 62 and 63 configuring the power conversion device 200.

According to the present embodiment, the module 8 configuring the power conversion device 100 is mounted on one face of the flat-type channel 13, the first face 68, and the half-bridge switching element 66 and the inverters 62 and 63 configuring the power conversion device 200 are mounted on another face, the second face 69, because of which both faces of the channel 13 can be used effectively as cooling faces, meaning that the cooler configured of the housing 12 and the channel 13 can be reduced in size, and the cooler can be reduced in cost. Also, as the channel 13 does not need to be provided in each of the power conversion device 100 and the power conversion device 200, the channel 13 can be reduced in cost. In the present embodiment, an example wherein the half-bridge switching element 66 and the inverters 62 and 63 configuring the power conversion device 200 are mounted on the second face 69 has been shown, but the same advantage is obtained by mounting the input capacitor 64, the step-up reactor 65, and the smoothing capacitor 67.

Also, the cooling face of the module 8 configuring the power conversion device 100 and the cooling face of the half-bridge switching element 66 and the inverters 62 and 63 configuring the power conversion device 200 are disposed in opposing directions, meaning that an extensive plane of the flat-type channel 13, which is of a simple configuration, can be used as a cooling face, and the cooler configured of the housing 12 and the channel 13 can be reduced in cost.

Also, as the direction in which the inverter 4 and the rectifying circuit 5 of the module 8 configuring the power conversion device 100 are aligned and the direction in which the half-bridge switching element 66 and the inverters 62 and 63 configuring the power conversion device 200 are aligned are the same, a longitudinal direction of a cooling area needed for the module 8 and the half-bridge switching element 66 and the inverters 62 and 63 and a longitudinal direction of the channel 13 can be unified, the cooling area of the channel 13 is reduced, and the cooler configured of the housing 12 and the channel 13 can be reduced in cost.

Furthermore, as the cooling water flows in a direction perpendicular to the direction in which the inverter 4 and the rectifying circuit 5 of the module 8 configuring the power conversion device 100 are aligned and the direction in which the half-bridge switching element 66 and the inverters 62 and 63 configuring the power conversion device 200 are aligned, none of the inverter 4 and the rectifying circuit 5 of the module 8, the half-bridge switching element 66, and the inverters 62 and 63 is affected by cooling water whose temperature rises due to heat generated by the others, a temperature rise can be restricted, and the module 8, the half-bridge switching element 66, and the inverters 62 and 63 can be reduced in size. Because of this, the cooler configured of the housing 12 and the channel 13 can be reduced in size, and the power conversion device 100 and the power conversion device 200 can be reduced in cost.

Furthermore, as the module 8 configuring the power conversion device 100 is disposed on the projection plane of the fin 72, a mounting face cooling performance increases owing to cooling water whose flow speed increases because of the fin 72, even with respect to the module 8 configuring the power conversion device 100, which is the side on which the fin 72 is not provided. Because of this, the module 8 and other heat generating parts of the power conversion device 100 on the projection plane of the fin 72 can be reduced in size, and can be reduced in cost.

Also, as the transformer 2 configuring the power conversion device 100 and one portion of the smoothing reactor 6 are outside the projection plane of the channel 13 and the fin 72, the inverter 4 and the rectifying circuit 5 of the module 8, and the half-bridge switching element 66, and the inverters 62 and 63, which are more efficiently cooled by the channel 13 than the transformer 2 and the smoothing reactor

6 as a cooling area with respect to height is greater, can be disposed with priority in the flat-type channel 13. Because of this, the module 8, the half-bridge switching element 66, and the inverters 62 and 63 can be reduced in size. Consequently, the cooler configured of the housing 12 and the channel 13 can be reduced in size, and the power conversion device 100 and the power conversion device 200 can be reduced in cost.

Figure 8:
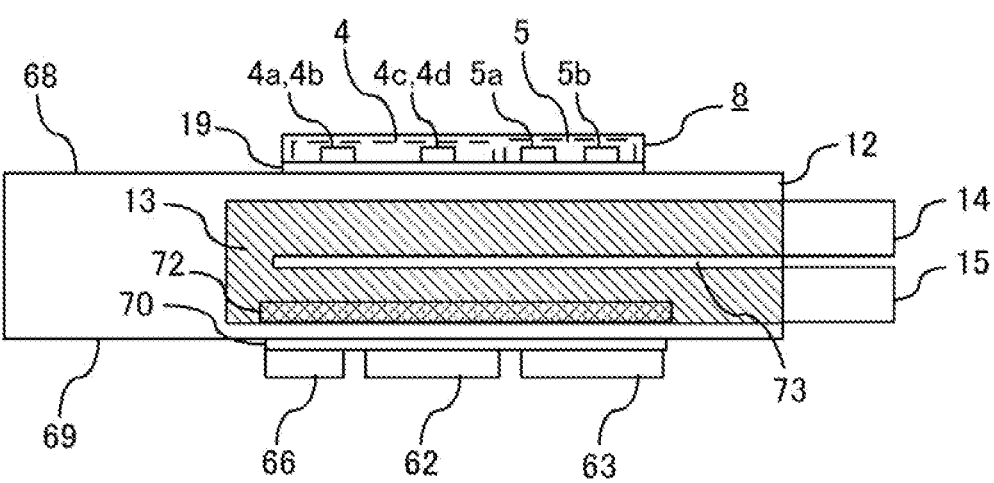
FIG. 8 is a side view showing another example of a mounted structure of the power conversion device according to the second embodiment.

In the present embodiment, an example wherein a channel cooling the power conversion device 100 and a channel cooling the power conversion device 200 are the same is shown as the flat-type channel 13, but as shown in FIG. 8, the channel 13 may be divided by providing a partition 73 of the housing 12 in a plane parallel to the plane of the channel 13 in the channel 13, whereby cooling water cooling the module 8 configuring the power conversion device 100 and cooling water cooling the half-bridge switching element 66 and the inverters 62 and 63 configuring the power conversion device 200 are separated.

As heretofore described, a configuration wherein an optimum channel can be applied to the module 8, the half-bridge switching element 66, and the inverters 62 and 63 is also such that by both faces of the channel 13 being used effectively as cooling faces, the cooler configured of the housing 12 and the channel 13 can be reduced in size, and the cooler can be reduced in cost.

In the present embodiment, an example wherein projection planes of the module 8 configuring the power conversion device 100 and the half-bridge switching element 66 and the inverters 62 and 63 configuring the power conversion device 200 coincide has been shown, but there may also be a region in which the projection planes do not coincide. Thermal interference between the module 8, the half-bridge switching element 66, and the inverters 62 and 63 decreases, because of which a temperature rise can be restricted. Also, the module 8, the half-bridge switching element 66, and the inverters 62 and 63 can be reduced in size, and the cooler configured of the housing 12 and the channel 13 can be reduced in size. Because of this, the power conversion device 100 and the power conversion device 200 can be reduced in cost.

In the present embodiment, an example wherein a step-up chopper and the inverters 62 and 63 are used as the power conversion device 200 has been shown, but there need not be a step-up chopper, and there may be only one inverter. Also, the power conversion device 200 may be a vehicle-mounted charger. In this case, an input of the vehicle-mounted charger is a system alternating current voltage, and an output is connected to the direct current power supply 1, because of which a configuration is such that the power conversion device 200 is connected to the output of the vehicle-mounted charger.

Although the present application is described above in terms of various exemplifying embodiments and implementations, it should be understood that the various features, aspects, and functions described in one or more of the individual embodiments are not limited in their applicability to the particular embodiment with which they are described, but instead can be applied, alone or in various combinations, to one or more other embodiments.

It is therefore understood that numerous modifications that have not been exemplified can be devised without departing from the scope of the present application. For example, at least one constituent component may be modified, added, or eliminated. At least one of the constituent components mentioned in at least one of the preferred embodiments may be selected and combined with the constituent components mentioned in another preferred embodiment.

Hereafter, aspects of the present disclosure will be summarized as appendices.

Appendix 1

A power conversion device, including a multiple of semiconductor switching elements that convert a direct current voltage of a direct current power supply into an alternating current voltage, an isolation transformer that transmits the alternating current voltage from a primary side to a secondary side, and outputs the alternating current voltage, and a rectifying circuit including a multiple of rectifying elements that rectify the output, wherein the multiple of semiconductor switching elements and the multiple of rectifying elements are configured of a module wherein the multiple of semiconductor switching elements and the multiple of rectifying elements are sealed in the same package.

Appendix 2

The power conversion device according to Appendix 1, wherein the multiple of semiconductor switching elements configure a full-bridge circuit.

Appendix 3

The power conversion device according to Appendix 1 or 2, wherein the multiple of rectifying elements are diodes.

Appendix 4

The power conversion device according to any one of Appendices 1 to 3, wherein the module has a cooling member that cools the multiple of semiconductor switching elements and the multiple of rectifying elements, and an isolating member that isolates at least either one of the multiple of semiconductor switching elements and the multiple of rectifying elements from the cooling member.

Appendix 5

The power conversion device according to any one of Appendices 1 to 4, wherein the module has external terminals that connect the multiple of semiconductor switching elements, the multiple of rectifying elements, and an external circuit, and the external terminals are disposed on at least two side faces of the module.

Appendix 6

The power conversion device according to Appendix 5, wherein the external terminals are configured to include primary side external terminals, which connect the multiple of semiconductor switching element and the external circuit, and secondary side external terminals, which connect the multiple of rectifying elements and the external circuit, the primary side external terminals are disposed on both side faces of the module sandwiching a mounting region of the multiple of semiconductor switching element, and the secondary side external terminals are disposed on both side faces of the module sandwiching a mounting region of the multiple of rectifying elements.

Appendix 7

The power conversion device according to Appendix 6, wherein the primary side external terminals and the secondary side external terminals are disposed in the same direction as a direction in which the mounting region of the multiple of semiconductor switching element and the mounting region of the multiple of rectifying elements are aligned.

Appendix 8

The power conversion device according to Appendix 6 or 7, wherein, of the primary side external terminals, a primary side direct current input terminal connected to the direct current power supply is disposed on a first side face of the module, and a primary side alternating current output terminal connected to the isolation transformer is disposed on a face opposite to the first side face.

Appendix 9

The power conversion device according to Appendix 6 or 7, wherein, of the secondary side external terminals, a secondary side alternating current input terminal connected to the isolation transformer is disposed on a second side face of the module, and a secondary side direct current output terminal connected to a load via the rectifying circuit is disposed on a face opposite to the second side face.

Appendix 10

The power conversion device according to any one of Appendices 6 to 9, wherein the primary side alternating current output terminal connected to the isolation transformer, of the primary side external terminals, and the secondary side alternating current input terminal connected to the isolation transformer, of the secondary side external terminals, are disposed on the same side face of the module.

Appendix 11

The power conversion device according to any one of Appendices 1 to 10, wherein the power conversion device has a cooler that cools the module, the isolation transformer, and the rectifying circuit.

Appendix 12

The power conversion device according to Appendix 11, wherein the power conversion device is configured by being combined with a second power conversion device, the module is mounted on a first face of the cooler, and at least one heat generating part configuring the second power conversion device is mounted on a second face, which is a face opposite to the first face.

Appendix 13

The power conversion device according to Appendix 12, wherein the heat generating part is a multiple of semiconductor switching elements configuring the second power conversion device.

Appendix 14

The power conversion device according to Appendix 13, wherein a cooling face of the module opposes a cooling face of the multiple of semiconductor switching elements configuring the second power conversion device across the cooler.

Appendix 15

The power conversion device according to Appendix 13, wherein the direction in which the mounting region of the multiple of semiconductor switching elements configuring the power conversion device and the mounting region of the multiple of rectifying elements are aligned is the same as a direction in which the multiple of semiconductor switching elements configuring the second power conversion device are aligned.

Appendix 16

The power conversion device according to any one of Appendices 11 to 15, wherein the cooler has a channel, and a direction of flow of a refrigerant flowing along the channel is a direction perpendicular to the direction in which the mounting region of the multiple of semiconductor switching elements configuring the power conversion device and the mounting region of the multiple of rectifying elements are aligned.

Appendix 17

The power conversion device according to any one of Appendices 12 to 15, wherein, when seen from a stacking direction in which the module and the cooler are stacked, at least one portion of the module coincides with a region of a cooling fin provided in the cooler on the second power conversion device side.

Appendix 18

The power conversion device according to any one of Appendices 11 to 15 and 17, wherein the cooler has a channel, and at least one portion of the isolation transformer, and of a smoothing reactor that smooths an output current of the multiple of rectifying elements, is on an outer side of a region in which the channel is disposed when seen from the stacking direction in which the module and the cooler are stacked.

What is claimed is:

1. A power conversion device, comprising:
a multiple of semiconductor switching elements that convert a direct current voltage of a direct current power supply into an alternating current voltage;
an isolation transformer that transmits the alternating current voltage from a primary side to a secondary side, and outputs the alternating current voltage; and
a rectifying circuit including a multiple of rectifying elements that rectify the output, wherein
the multiple of semiconductor switching elements and the multiple of rectifying elements are configured of a module wherein the multiple of semiconductor switching elements and the multiple of rectifying elements are sealed in the same package,
wherein the multiple of semiconductor switching elements and the multiple of rectifying elements are disposed on a first side surface of an isolation member.

2. The power conversion device according to claim 1, wherein the multiple of semiconductor switching elements configure a full-bridge circuit.

3. The power conversion device according to claim 2, wherein the module has a cooling member that cools the multiple of semiconductor switching elements and the multiple of rectifying elements, and the isolating member that isolates at least either one of the multiple of semiconductor switching elements and the multiple of rectifying elements from the cooling member.

4. The power conversion device according to claim 2, wherein the module has external terminals that connect the multiple of semiconductor switching element, the multiple of rectifying elements, and an external circuit, and
the external terminals are disposed on at least two side faces of the module.

5. The power conversion device according to claim 1, wherein the multiple of rectifying elements are diodes.

6. The power conversion device according to claim 1, wherein the module has a cooling member that cools the multiple of semiconductor switching elements and the multiple of rectifying elements, and the isolating member that isolates at least either one of the multiple of semiconductor switching elements and the multiple of rectifying elements from the cooling member.

7. The power conversion device according to claim 1, wherein the module has external terminals that connect the multiple of semiconductor switching element, the multiple of rectifying elements, and an external circuit, and
the external terminals are disposed on at least two side faces of the module.

8. The power conversion device according to claim 7, wherein the external terminals are configured to include primary side external terminals, which connect the multiple of semiconductor switching element and the external circuit, and secondary side external terminals, which connect the multiple of rectifying elements and the external circuit, the primary side external terminals are disposed on both side faces of the module sandwiching a mounting region of the multiple of semiconductor switching element, and the secondary side external terminals are disposed on both side faces of the module sandwiching a mounting region of the multiple of rectifying elements.

9. The power conversion device according to claim 8, wherein the primary side external terminals and the secondary side external terminals are disposed in the same direction as a direction in which the mounting region of the multiple of semiconductor switching element and the mounting region of the multiple of rectifying elements are aligned.

10. The power conversion device according to claim 8, wherein, of the primary side external terminals, a primary side direct current input terminal connected to the direct current power supply is disposed on a first side face of the module, and a primary side alternating current output terminal connected to the isolation transformer is disposed on a face opposite to the first side face.

11. The power conversion device according to claim 8, wherein, of the secondary side external terminals, a secondary side alternating current input terminal connected to the isolation transformer is disposed on a second side face of the module, and a secondary side direct current output terminal connected to a load via the rectifying circuit is disposed on a face opposite to the second side face.

12. The power conversion device according to claim 8, wherein the primary side alternating current output terminal connected to the isolation transformer, of the primary side external terminals, and the secondary side alternating current input terminal connected to the isolation transformer, of the secondary side external terminals, are disposed on the same side face of the module.

13. The power conversion device according to claim 1, wherein the power conversion device has a cooler that cools the module, the isolation transformer, and the rectifying circuit.

14. The power conversion device according to claim 13, wherein the power conversion device is configured by being combined with a second power conversion device, the module is mounted on a first face of the cooler, and at least one heat generating part configuring the second power conversion device is mounted on a second face, which is a face opposite to the first face.

15. The power conversion device according to claim 14, wherein the heat generating part is a multiple of semiconductor switching elements configuring the second power conversion device.

16. The power conversion device according to claim 15, wherein a cooling face of the module opposes a cooling face of the multiple of semiconductor switching elements configuring the second power conversion device across the cooler.

17. The power conversion device according to claim 15, wherein the direction in which the mounting region of the multiple of semiconductor switching elements configuring the power conversion device and the mounting region of the multiple of rectifying elements are aligned is the same as a direction in which the multiple of semiconductor switching elements configuring the second power conversion device are aligned.

18. The power conversion device according to claim 14, wherein, when seen from a stacking direction in which the module and the cooler are stacked, at least one portion of the module coincides with a region of a cooling fin provided in the cooler on the second power conversion device side.

19. The power conversion device according to claim 13, wherein the cooler has a channel, and a direction of flow of a refrigerant flowing along the channel is a direction perpendicular to the direction in which the mounting region of the multiple of semiconductor switching elements configuring the power conversion device and the mounting region of the multiple of rectifying elements are aligned.

20. The power conversion device according to claim 13, wherein the cooler has a channel, and at least one portion of the isolation transformer, and of a smoothing reactor that smooths an output current of the multiple of rectifying elements, is on an outer side of a region in which the channel is disposed when seen from the stacking direction in which the module and the cooler are stacked.

* * * * *